(12) United States Patent
Haiberger et al.

(10) Patent No.: US 11,480,744 B2
(45) Date of Patent: Oct. 25, 2022

(54) OPTOELECTRONIC COMPONENT AND DISPLAY DEVICE

(71) Applicant: OSRAM OLED GmbH, Regensburg (DE)

(72) Inventors: Luca Haiberger, Regensburg (DE); Daniel Richter, Bad Abbach (DE)

(73) Assignee: OSRAM OLED GmbH, Regensburg (DE)

( * ) Notice: Subject to any disclaimer, the term of this patent is extended or adjusted under 35 U.S.C. 154(b) by 15 days.

(21) Appl. No.: 17/252,908

(22) PCT Filed: Jul. 16, 2019

(86) PCT No.: PCT/EP2019/069164
§ 371 (c)(1),
(2) Date: Dec. 16, 2020

(87) PCT Pub. No.: WO2020/016254
PCT Pub. Date: Jan. 23, 2020

(65) Prior Publication Data
US 2021/0318501 A1    Oct. 14, 2021

(30) Foreign Application Priority Data
Jul. 20, 2018   (DE) .......................... 102018117591.4

(51) Int. Cl.
*G02B 6/42* (2006.01)
*H01L 33/58* (2010.01)
*H01L 25/075* (2006.01)

(52) U.S. Cl.
CPC ............. *G02B 6/4214* (2013.01); *G02B 6/42* (2013.01); *G02B 6/4298* (2013.01); *H01L 33/58* (2013.01); *H01L 25/0753* (2013.01)

(58) Field of Classification Search
CPC ...... G02B 6/42; G02B 6/4214; G02B 6/4298; H01L 25/0753; H01L 27/15; H01L 33/44;
(Continued)

(56) References Cited

U.S. PATENT DOCUMENTS 10,663,630 B2 *   5/2020   Larsen ..................... G02B 5/00
2011/0121731 A1   5/2011   Tsutsumi et al.
(Continued)

FOREIGN PATENT DOCUMENTS

DE         102012112149 A1    6/2014

OTHER PUBLICATIONS

International Search Report for International Patent Application No. PCT/EP2019/069164, dated Oct. 16, 2019 (5 pages).

*Primary Examiner* — Michael P Mooney
(74) *Attorney, Agent, or Firm* — ArentFox Schiff LLP

(57) ABSTRACT

In one embodiment, the optoelectronic component comprises a first emission zone, which emits electromagnetic radiation during operation. Furthermore, the component comprises an optical waveguide with an entrance side facing the first emission zone, a distribution element and with output coupling structures on a side of the distribution element facing away from the first emission zone. The optical waveguide is a simply connected solid body. In a top view of the side of the optical waveguide facing away from the first emission zone, the distribution element completely covers the first emission zone. The output coupling structures are individual, spaced-apart elevations, each of which extends away from the distribution element and comprises an output coupling surface at an end facing away from the distribution element. A structure that is nontransmissive to the radiation of the first emission zone is arranged on the optical waveguide in the region between the output coupling structures.

17 Claims, 5 Drawing Sheets

Figure 1A:
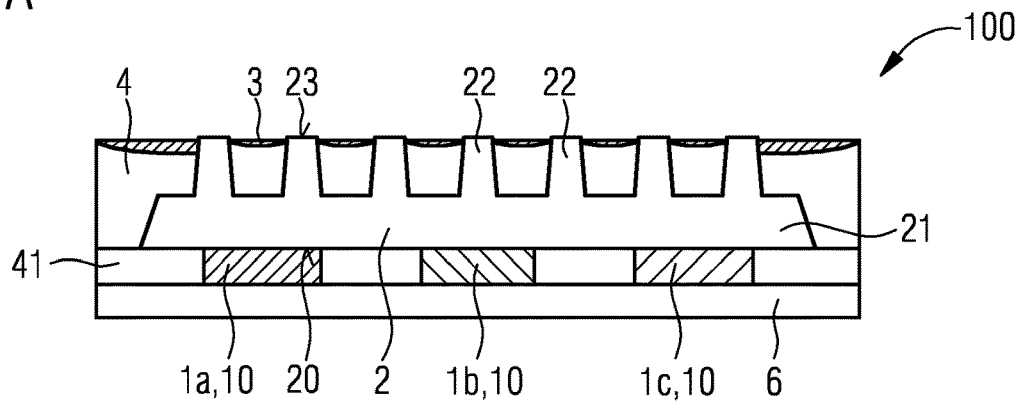

(58) Field of Classification Search
CPC ....... H01L 33/46; H01L 33/486; H01L 33/58; H01L 33/60
USPC .......................................... 385/31, 39, 901
See application file for complete search history.

(56) References Cited

U.S. PATENT DOCUMENTS

2012/0299032 A1  11/2012  Li
2014/0203306 A1   7/2014  Ito
2015/0311407 A1  10/2015  Göötz et al.
2016/0291235 A1  10/2016  Oh et al.
2017/0261161 A1   9/2017  Moon et al.
2017/0294418 A1  10/2017  Edmond et al.

* cited by examiner

OPTOELECTRONIC COMPONENT AND DISPLAY DEVICE

This application is a 35 U.S.C. § 371 National Phase of PCT Application No. PCT/EP2019/069164, filed Jul. 16, 2019, which claims priority to German Patent Application No. 102018117591.4, filed Jul. 20, 2018, the disclosures of each of which are hereby incorporated by reference herein in their entireties.

An optoelectronic component is specified. Furthermore a display device is specified.

A task to be solved is to specify an optoelectronic component with a high contrast ratio. A further task to be solved is to specify a display device with such an optoelectronic component.

These tasks are solved, among others, by the subject-matter of patent claim 1 and patent claim 16. Advantageous embodiments and further developments are the subject of the dependent patent claims.

According to at least one embodiment, the optoelectronic component comprises a first emission zone emitting electromagnetic radiation during specified normal operation. The electromagnetic radiation is preferably light in the visible spectral range.

The first emission zone is a region or section of the component in which radiation is generated and emitted. In a top view, the emission zone emits radiation over the entire surface of a continuous, preferably a simply connected area. For example, this area of the first emission zone is at least $10\times10$ $\mu m^2$ or at least $50\times50$ $\mu m^2$ or at least $100\times100$ $\mu m^2$. Alternatively or additionally, the area can be at most $500\times500$ $\mu m^2$ or at most $300\times300$ $\mu m^2$ or at most $200\times200$ $\mu m^2$ in size.

The first emission zone is realized, for example, by an optoelectronic semiconductor chip or by an individually controllable segment of an optoelectronic semiconductor chip. The semiconductor chip or segment generates a primary radiation during operation. This radiation can be partially or completely converted into a secondary radiation by an additional conversion element on the semiconductor chip. The resulting radiation is the radiation of the first emission zone. For example, the size of the emission zone is essentially determined by the size of the semiconductor chip or the segment or conversion element.

A semiconductor chip is here and in the following a separately manageable and electrically contactable element. A semiconductor chip comprises a semiconductor layer sequence with an active layer. A semiconductor chip is created in particular by separation from a wafer compound. In particular, the side surfaces of such a semiconductor chip comprise traces from the separation process of the wafer compound. A semiconductor chip preferably comprises exactly one originally connected region of the semiconductor layer sequence grown in the wafer compound. The semiconductor layer sequence of the semiconductor chip is preferably formed coherently. The lateral extension of the semiconductor chip, measured parallel to the main extension direction of the active layer, is for example at most 1% or at most 5% larger than the lateral extension of the active layer or the semiconductor layer sequence. The semiconductor chip still comprises, for example, the growth substrate on which the entire semiconductor layer sequence is grown.

The lateral expansion of a semiconductor chip is understood here in particular as an extension or expansion in any lateral direction. A lateral direction is a direction parallel to the main extension plane of the active layer.

In particular, the active layer of the semiconductor layer sequence contains at least one pn-junction and/or at least one quantum well structure and can, for example, generate electromagnetic radiation in the blue or green or red spectral region or in the UV or IR region when operated as intended. The active layer can be continuous or segmented.

According to at least one embodiment, the optoelectronic component comprises an optical waveguide downstream of the first emission zone. The optical waveguide comprises an entrance side facing the first emission zone, a distribution element and output coupling structures on a side of the distribution element facing away from the first emission zone.

The optical waveguide is preferably arranged downstream of the first emission zone in a main radiation direction of the first emission zone. In particular, the optical waveguide is transparent or transmissive for the radiation emitted by the first emission zone. The entrance side is an outer side of the optical waveguide. In particular, the entrance side is formed by the distribution element. The entrance side can be flat within the manufacturing tolerance.

According to at least one embodiment, the optical waveguide is a simply connected solid body. This means that the optical waveguide consists of a solid, dimensionally stable material, such as plastic or glass or silicone, which forms a simply connected body. Within the manufacturing tolerance, the optical waveguide is thus free of inclusions or cavities that are completely surrounded by the solid material. In particular, the optical waveguide is made monolithic or in one piece. This means that all regions of the optical waveguide are formed integrally with each other and comprise or consist of the same material. Also only the distributor element can be formed in one piece. In this case, the output coupling structures are not formed in one piece with the distributor element for example.

According to at least one embodiment, the distribution element covers the first emission zone completely in a top view of the side of the optical waveguide facing away from the first emission zone. The distribution element is preferably a simply connected section or partial body of the optical waveguide, whose extension is larger than the first emission zone.

According to at least one embodiment, the output coupling structures are individual, spaced-apart elevations, which each extend away from the distribution element and each comprise an output coupling surface at an end facing away from the distribution element.

The elevations are in particular rod-shaped or fibrous or cylindrical or pyramid-shaped or conical elevations which, starting from the distribution element, extend in the direction away from the distribution element and away from the first emission zone.

The output coupling structures are preferably simply connected sections or partial bodies of the optical waveguide. The output coupling structures are preferably arranged regularly or periodically on the distribution element. For example, the output coupling structures are distributed over at least 75% of the surface of the side of the distribution element facing away from the component. In a top view of a side of the optical waveguide facing away from the first emission zone, for example, at least two or at least four or at least ten output coupling structures partially or completely overlap the first emission zone. For example, the optical waveguide comprises at least ten or at least 20 or at least 50 or at least 100 such output coupling structures.

The output coupling surfaces of the output coupling structures are the outer surfaces of the output coupling structures facing away from the distribution element. For example, the output coupling surfaces are flat within the manufacturing tolerance. The output coupling surfaces can be roughened. For example, the output coupling surfaces are each at least 10 μm² or at least 50 μm² or at least 100 μm² in size. Alternatively or additionally, the output coupling surfaces can be at most 500 μm² or at most 250 μm² in size.

According to at least one embodiment, the radiation emitted by the first emission zone enters the optical waveguide via the entrance side during normal operation of the component. The radiation then passes through the distribution element and finally exits the optical waveguide via the output coupling surface of the output coupling structures. This means that after passing through the distribution element, the radiation enters the output coupling structures, passes through them and finally hits the output coupling surface.

For example, at least 90% or at least 95% of the radiation of the first emission zone entering the optical waveguide is emitted via the output coupling surface. For example, at least 80% or at least 90% or at least 95% of the radiation emitted by the first emission zone is coupled into the optical waveguide via the entrance side.

According to at least one embodiment, a structure that is nontransmissive to the radiation of the first emission zone is arranged on the optical waveguide in the region between the output coupling structures. This means that the nontransmissive structure is arranged on a side of the optical waveguide facing away from the first emission zone.

"nontransmissive" here means in particular that at most 5% or at most 3% or at most 1% of a radiation emitted by the first emission zone, which hits the nontransmissive structure, also passes through the nontransmissive structure. The nontransmissive structure may be a shaped body or a layer located in the region between the output coupling structures. As a layer, for example, the nontransmissive structure comprises a layer thickness of at most 4 μm or, at most 2 μm or, or at most 1 μm. The nontransmissive structure may, for example, comprise or consist of a silicone or a resin with particles incorporated therein, in particular black particles such as soot particles.

In a top view of the side of the optical waveguide facing away from the first emission zone, the nontransmissive structure covers the optical waveguide in the region between the output coupling structures. Seen in this top view, the nontransmissive structure preferably covers a large part, for example at least 70% or at least 80% or at least 90%, of the total area of the optical waveguide seen in this top view. Alternatively or additionally, in this top view the nontransmissive structure covers at most 99% or at most 95% or at most 90% of the total area of the optical waveguide as seen in this top view. In the same top view, the output coupling surfaces take up, for example, at least 1% or at least 5% or at least 10% of the total area of the optical waveguide. Alternatively or in addition, in this top view the output coupling surfaces may occupy at most 30% or at most 20% or at most 10% of the total area of the optical waveguide. In this top view, for example, the nontransmissive structure covers all areas of the optical waveguide outside the output coupling surfaces to at least 90% or at least 95% or completely.

In at least one embodiment, the optoelectronic component includes a first emission zone that emits electromagnetic radiation during operation. Furthermore, the component comprises an optical waveguide downstream of the first emission zone with an entrance side facing the first emission zone, a distribution element and with output coupling structures on a side of the distribution element facing away from the first emission zone. The optical waveguide is a simply connected solid body. In a top view of the side of the optical waveguide facing away from the first emission zone, the distribution element completely covers the first emission zone. The output coupling structures are individual, spaced-apart elevations, each of which extends away from the distribution element and comprises an output coupling surface at an end facing away from the distribution element. In normal operation, the radiation emitted by the first emission zone enters the optical waveguide via the entrance side, then passes through the distribution element and finally exits the optical waveguide via the output coupling surfaces of the output coupling structures. A structure that is nontransmissive to the radiation of the first emission zone is arranged on the optical waveguide in the region between the output coupling structures.

The present invention is based in particular on the realization that optoelectronic components, in particular LEDs, for video screens should look as dark as possible when switched off, so that the ratio between maximum and minimum brightness on the screen is as large as possible. Therefore a high contrast is desired. Furthermore, a downward emission is often advantageous for video screens, because it is usually located above the observers.

In the present invention, an optical waveguide is applied to an emission zone representing, for example, a sub-pixel. The region facing the emission zone, namely the distribution element, can mix the radiation coming from the emission zone, while the region facing away from the emission zone comprises transparent output coupling structures, such as fibers or rods, and serves for light extraction. Outside the output coupling surfaces, the optical waveguide is covered by a structure that is nontransmissive to the radiation emitted by the first emission zone. This allows a high optical contrast to be achieved. In addition, the radiation angle can be adjusted by the orientation of the output coupling structures.

According to at least one embodiment, the component comprises one or more further emission zones, each of which emits electromagnetic radiation during operation. For example, the component comprises three or four emission zones. In particular, each of the emission zones forms a region or section of the component in which radiation is generated and emitted. The different emission zones can be so called subpixels of the device.

The individual emission zones can preferably be operated individually and independently of each other. This means that the different emission zones can be switched on and off independently and thus emit radiation independently of each other. In a top view of the side of the optical waveguide facing away from the first emission zone, the different emission zones are preferably next to each other and do not overlap.

The previously specified details for the first emission zone, for example regarding its size, its arrangement with respect to the optical waveguide and so on, can apply accordingly to the further emission zones.

According to at least one embodiment, in a top view of a side of the optical waveguide facing away from the first emission zone, the distribution element covers the further emission zone(s) partially or completely. In particular, the distribution element covers the further emission zone(s) in the same top view as it covers the first emission zone. In this top view, each emission zone overlaps for example with at least two or at least four or at least ten output coupling structures.

According to at least one embodiment, the radiation coming from the emission zones enters the optical waveguide via the entrance side during normal operation and is mixed in the distribution element. That means, if two or more emission zones of the component are operated simultaneously and emit radiation at the same time, the radiation of these two emission zones is mixed in the distribution element. The radiation emerging from the optical waveguide via the output coupling surfaces is then mixed radiation from the radiation of the emission zones.

According to at least one embodiment, the radiation coming from two different emission zones is radiation of different wavelength ranges. In particular, two different emission zones emit differently colored light. For example, a first emission zone emits blue light during operation, a second emission zone emits green light and a third emission zone emits red light. In particular, a mixture of the radiation emitted by the different emission zones is white light. The nontransmissive structure is preferably nontransmissive to the radiation of each of the emission zones.

According to at least one embodiment, the optoelectronic component comprises a plurality of optoelectronic semiconductor chips arranged on a common carrier. One semiconductor chip is biunique assigned to each emission zone.

The semiconductor chips of the device can be of the same design, for example comprising the same sequence of semiconductor layers. In order to achieve that the different emission zones emit different radiation, different conversion elements can be applied to different semiconductor chips. Alternatively, it is also possible that the primary radiation intrinsically generated and subsequently emitted by the semiconductor chips are already different. In this case, different semiconductor chips of the device comprise different semiconductor materials, for example. Conversion elements are then not necessary, for example.

The carrier for the semiconductor chips is a printed circuit board or a semiconductor body with integrated switches, for example. Then a separate switch can be assigned to each semiconductor chip.

Instead of using different semiconductor chips to realize the different emission zones, the same semiconductor chip can be assigned to several or all emission zones. In this case, the different emission zones can be biunique assigned individually and independently controllable segments or pixels of the semiconductor chip. The semiconductor chip is then a pixelated semiconductor chip. Preferably in this case, the component comprises only a single semiconductor chip.

According to at least one embodiment, the output coupling structures are elongated elevations each with a longitudinal axis transverse to a main extension plane of the distribution element.

The main extension plane of a body is a virtual plane through this body, which is chosen in such a way that the average distance of all points of the body to the plane is minimal. The longitudinal axis of a body is in this case an axis through a body, which is chosen in such a way that the average distance of all points of the body to the axis is minimal.

The main extension plane of the distribution element preferably runs essentially, i.e. within the manufacturing tolerance, parallel to a main extension plane of the optoelectronic component. For example, the main extension plane of the optoelectronic component is essentially parallel to the main extension plane of the carrier on which the semiconductor chips are arranged.

An extension of the distribution element along the main extension plane of the distribution element is preferably at least three times or at least five times or at least ten times larger than an extension of the distribution element perpendicular to the main extension plane. The extension perpendicular to the main extension plane is here called thickness of the distribution element.

The extensions of the output coupling structures along their longitudinal axes are for example at least twice as large or at least five times as large or at least ten times as large as the extensions in the directions perpendicular to the longitudinal axes. The expansion of the output coupling structures parallel to their longitudinal axes is for example at least 10 µm or at least 50 µm or at least 100 µm. Alternatively or additionally, the expansion parallel to the longitudinal axis can be at most 200 µm or at most 150 µm. The diameter of the output coupling structures, measured perpendicular to the longitudinal axis, is for example at least 1 µm or at least 5 µm. Alternatively or additionally, the diameter can be at most 50 µm or at most 20 µm.

Preferably, the longitudinal axes of all output coupling structures are parallel to each other within the manufacturing tolerance. Alternatively, the longitudinal axes of the output coupling structures can also be skewed to each other.

The output coupling surfaces of the output coupling structures preferably run perpendicular to the longitudinal axes within the manufacturing tolerance.

According to at least one embodiment, the longitudinal axes of the output coupling structures are perpendicular to the main extension plane of the distribution element within the manufacturing tolerance. The radiation emerging from an output coupling surface of an output coupling structure then preferably has a main emission direction perpendicular to the main extension plane of the distribution element.

According to at least one embodiment the longitudinal axes of the output coupling structures are tilted with respect to a normal to the main extension plane of the distribution element. For example, the longitudinal axes form an angle of at least 10° or at least 20° or at least 30° with respect to a normal to the main extension plane of the distribution element. Alternatively or additionally, the angle between the longitudinal axes and a normal to the main extension plane of the distribution element can be at most 70° or at most 60° or at most 45°.

With such an embodiment of the output coupling structures, the radiation emerging via the output coupling surfaces of the output coupling structures preferably has a main emission direction which is not perpendicular to the main extension plane of the distribution element. If the component described here is used for example in a video wall, such an embodiment can direct the light emission for example downwards towards an observer.

According to at least one embodiment, the distribution element is an essentially platelet-shaped section or partial body of the optical waveguide. The extensions in all directions parallel to the main extension plane of the distribution element are larger, for example by a factor of at least 3 or at least 5 or at least 10, than the extension of the distribution element perpendicular to the main extension plane. For example, an extension of the distribution element parallel to its main extension plane is at least 500 µm or at least 1000 µm or at least 2000 µm. Alternatively or additionally the expansion parallel to the main extension plane can be at most 5000 µm or at most 3000 µm. The expansion perpendicular to the main extension plane is for example at least 200 µm or at least 500 µm. Alternatively or additionally the expansion perpendicular to the main extension plane can be at most 1500 µm or 1000 µm.

According to at least one embodiment, the optical waveguide is completely covered with the nontransmissive structure except for the output coupling surfaces when viewed from above on a side of the optical waveguide facing away from the first emission zone.

According to at least one embodiment, the nontransmissive structure is absorbing the radiation emitted by the first emission zone. Preferably, the nontransmissive structure is also nontransmissive for the radiation coming from the further emission zones.

Absorbing radiation means that the nontransmissive structure absorbs at least 90% or at least 95% or at least 99% of this radiation. In particular, the nontransmissive structure is absorbing visible light. Particularly preferable, the nontransmissive structure appears black to an observer. If an observer then looks at the side of the optical waveguide facing away from the first emission zone and the emission zone(s) is (are) switched off, the component appears black. The component is therefore particularly suitable as a pixel in a monitor or video screen.

According to at least one embodiment, the optoelectronic component further comprises a shaped body between the output coupling structures, which surrounds the output coupling structures. For example, the shaped body is an encapsulation applied to the optical waveguide.

The shaped body can positively contour or surround the output coupling structures in regions outside the output coupling surfaces. For example, the shaped body lies directly on the optical waveguide and/or the output coupling structures. For example, in top view of a side of the optical waveguide facing away from the first emission zone, each output coupling structures is completely surrounded by the shaped body. Then, for example, only the regions of the output coupling surfaces are free of the shaped body.

In particular, the shaped body is a coherent, but not simply connected body. For example, the shaped body is crossed by the output coupling structures. The shaped body can be designed in monolithically or in one piece. For example, the shaped body comprises or consists of a plastic or a silicone or a resin.

According to at least one embodiment, the shaped body is nontransmissive to the radiation emitted by the first emission zone. "nontransmissive" has the same meaning as specified for the nontransmissive structure. Preferably, the shaped body is also nontransmissive for the radiation of the further emission zones.

According to at least one embodiment, the nontransmissive structure is arranged on a side of the shaped body remote from the distribution element. In this case, for example, the nontransmissive structure is a layer on the shaped body. The nontransmissive structure then covers the shaped body in a top view of a side of the optical waveguide facing away from the component, for example to at least 90% or completely.

Alternatively, it is also possible that the shaped body itself forms the nontransmissive structure.

According to at least one embodiment, the shaped body is reflective for the radiation emitted by the first emission zone. For example, the shaped body then comprises a silicone or resin with embedded reflective particles, such as $TiO_2$ particles. "Reflective" here means in particular that the shaped body reflects at least 90% or at least 95% of the radiation emitted by the first emission zone and incident on the shaped body. Preferably, the shaped body is then also reflective for the radiation emitted by the further emission zones. The shaped body is particularly preferably reflective for visible light. For example, the shaped body appears white to an observer.

According to at least one embodiment, the component comprises an optoelectronic semiconductor chip assigned to the first emission zone, on which the optical waveguide is glued. For example, a silicone adhesive is used. In this case, the entrance side of the optical waveguide is preferably flat within the manufacturing tolerance. If the component comprises several optoelectronic semiconductor chips, the optical waveguide can be glued to any of these semiconductor chips.

According to at least one embodiment, the component comprises an optoelectronic semiconductor chip assigned to the first emission zone, which is partially embedded in the optical waveguide. For example, the optical waveguide is an encapsulation body with which the semiconductor chip is partially encapsulated. If the component comprises several optoelectronic semiconductor chips, all semiconductor chips can be embedded in the optical waveguide. In this case, the entrance side of the optical waveguide comprises, for example, indentations in which a semiconductor chip is arranged in each case. In this case, the semiconductor chips are, for example, laterally surrounded or formed by the optical waveguide.

According to at least one embodiment, the component comprises an optoelectronic semiconductor chip assigned to the first emission zone, which is embedded in a shaped body, whereby the shaped body prevents radiation from exiting the semiconductor chip in a lateral direction. The shaped body can laterally surround the semiconductor chip(s) of the device. Lateral is a direction parallel to the main extension plane of the device. For example, the shaped body can be reflective or absorptive, whereby the above definitions of reflective and absorptive also apply here.

The shaped body can be the same shaped body that is located between the output coupling structures. It can be the shaped body between the output coupling structures but also an element different from the shaped body around the semiconductor chip.

Furthermore, a display device is specified. The display device comprises an optoelectronic component described herein. All features disclosed in connection with the optoelectronic component are therefore also disclosed for the display device and vice versa.

The display device is in particular a screen or a video screen. For example, the display device comprises a multiplicity of the optoelectronic components described herein. For example, the display device comprises at least 100 or at least 1000 or at least 100000 or at least 1000000 such optoelectronic components. Each of the optoelectronic components can form one pixel of the display device. The individual optoelectronic components of the display device can preferably be operated individually and independently of each other. This means that each of the optoelectronic components of the display device can emit radiation independently of the other optoelectronic components.

The optical waveguides of different components of the display device are, for example, separated from each other and do not hang together and/or are not integrally formed. Alternatively, it is also possible that the optical waveguides of several or all components are connected and are, for example, formed in one piece. The connected optical waveguides then form an optical waveguide compound. In the region between two components, the optical waveguide compound can be free of output coupling structures. In addition, in the region between two components, the thickness of the optical waveguide compound can be reduced to reduce optical crosstalk between adjacent components. For example, the thickness of the optical waveguide compound in the region between two components is at most half or at most ⅓ or at most ¼ of the thickness of the distribution elements.

In the following, an optoelectronic component described herein as well as a display device described herein are explained in more detail with reference to drawings based on exemplary embodiments. Identical reference signs specify identical elements in the individual figures. However, no true-to-scale references are shown. For better understanding, individual elements may be shown in excessive size.

Figure 5:
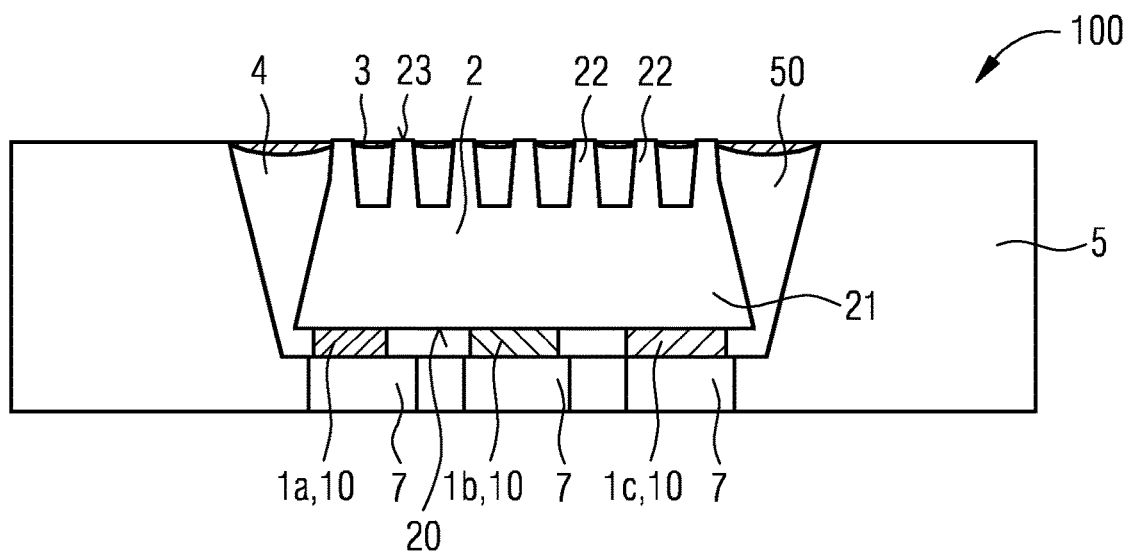
Figure 6:
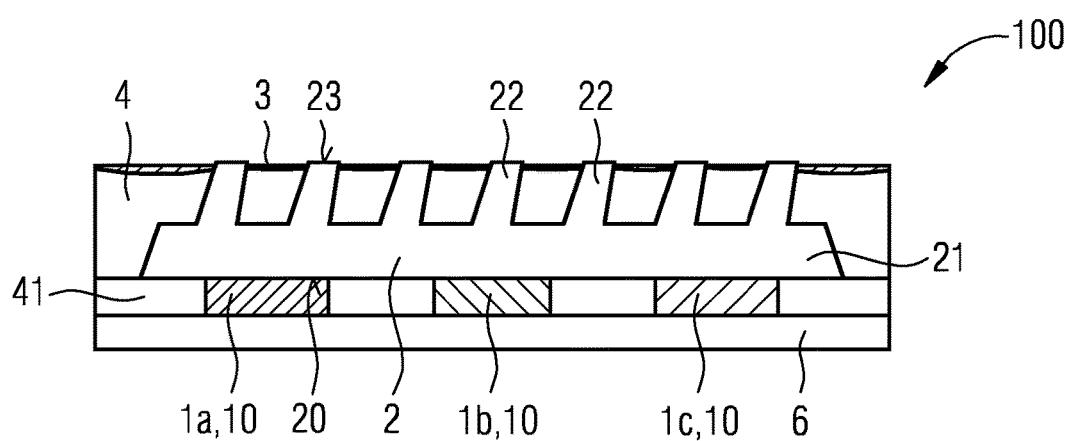
Figure 7A:
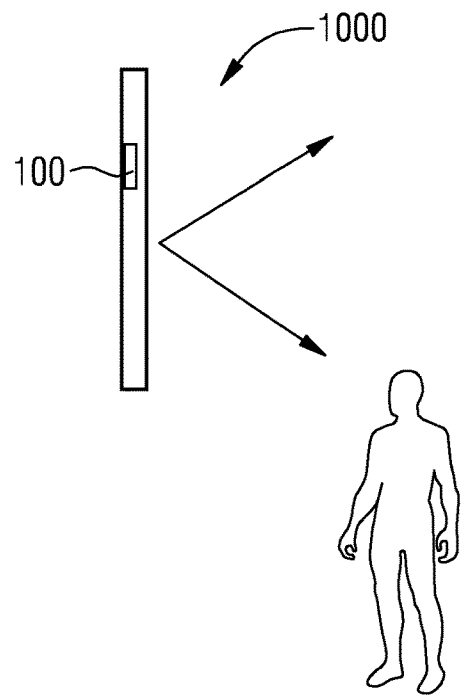
Figure 7B:
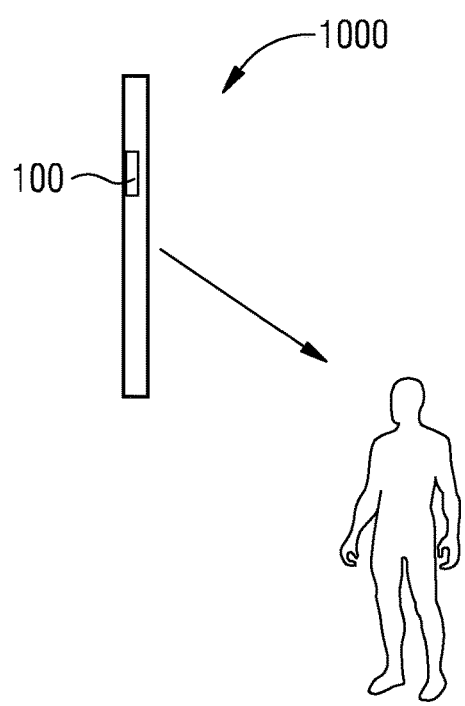
Figure 8A:
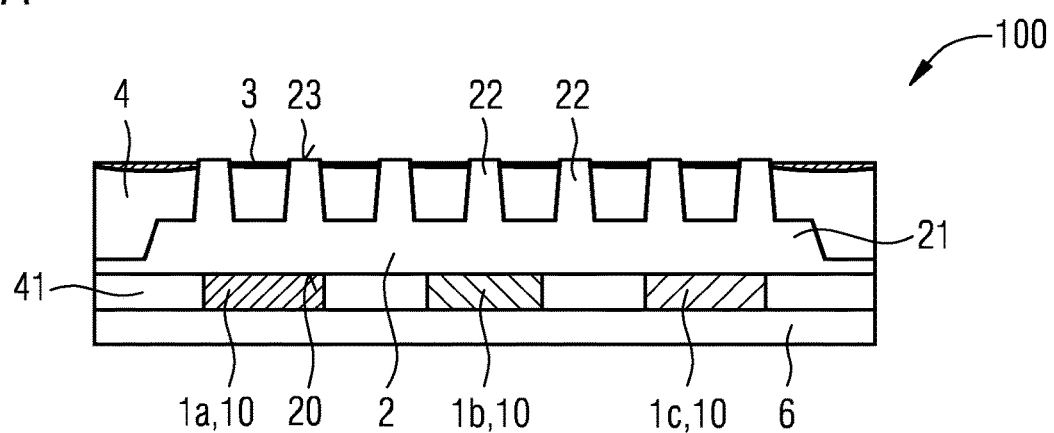
Figure 8B:
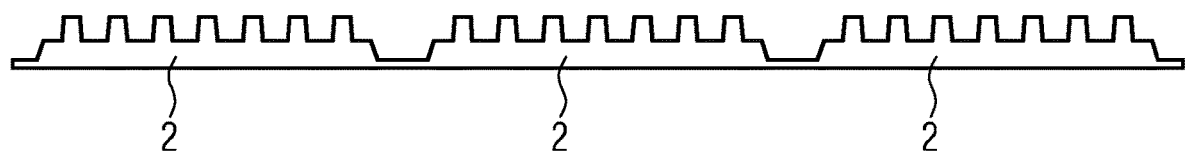

Showing in:

FIGS. 1A to 6 and 8A different exemplary embodiments of the optoelectronic component in cross-sectional view and top view, FIGS. 7A and 7B different exemplary embodiments of the display device, FIG. 8B an exemplary embodiment of an optical waveguide compound.

FIG. 1A shows a first exemplary embodiment of the optoelectronic component 100 in cross-sectional view. The optoelectronic component 100 in this example comprises a carrier 6, for example a printed circuit board or a semiconductor carrier with integrated switches. Furthermore, the optoelectronic component 100 comprises three semiconductor chips 10. Each of the semiconductor chips 10 is biunique assigned to an emission zone 1a, 1b, 1c. The semiconductor chips 10, for example, are GaN-based chips that emit blue primary radiation during operation.

The emission zones 1a, 1b, 1c or the assigned semiconductor chips 10 are preferably individually and independently controllable. In particular, the emission zones 1a, 1b, 1c form subpixels of the component 100.

A first emission zone 1a, for example, is configured to emit red light during operation. For this purpose, for example, a corresponding conversion element is applied to the semiconductor chip 10 assigned to the first emission zone 1a. A second emission zone 1b is configured, for example, to emit green light during operation. For this purpose, for example, a corresponding conversion element is again applied to the semiconductor chip 10 assigned to the second emission zone 1b. A third emission zone 1c, for example, is configured to emit blue light. In this case, for example, no conversion element is used.

However, the semiconductor chips assigned to the different emission zones 1a, 1b, 1c can also generate intrinsically differently colored primary radiation. Conversion elements are then not necessary, for example.

The semiconductor chips 10 are partially embedded in a shaped body 41. The shaped body 41 laterally surrounds the semiconductor chips 10 so that the light exiting the semiconductor chips 10 at the sides is reflected back. For this purpose, the shaped body 41 is made of a silicone with embedded $TiO_2$ particles, for example.

The optoelectronic component 100 also comprises an optical waveguide 2 with an entrance side 20 facing the first emission zone 1a or the semiconductor chips 10, a distribution element 21 and output coupling structures 22 on a side of the distribution element 21 facing away from the first emission zone 1a. The optical waveguide 2 is a simply connected solid body, for example made of clear silicone or glass or plastic. The optical waveguide 2 is preferably formed in one piece. In particular, the optical waveguide 2 is transmissive to the radiation emitted by the first emission zone 1a.

The entrance side 20 is flat within the manufacturing tolerance. The optical waveguide 2, for example, is glued to the semiconductor chips 10 with the entrance side 20 first.

The distribution element 21 is a plate-shaped element whose main extension plane is essentially parallel to the main extension plane of the carrier 6 of component 100. In a top view of a side of the optical waveguide 2 facing away from the first emission zone 1a, the distribution element 21 covers all emission zones 1a, 1b, 1c.

The output coupling structures 22 are elongated or fiber-like elevations, present in the form of truncated cones or truncated pyramids, which extend in the direction away from the distribution element 21. The longitudinal axes of the output coupling structures 22 are essentially perpendicular to the main extension plane of the distribution element 21.

During operation of component 100, the light emitted by emission zones 1a, 1b, 1c hits the entrance side 20 of optical waveguide 2 and then enters the optical waveguide 2.

The light emitted from the different emission zones 1a, 1b, 1c is mixed in the distribution element 21. The resulting mixed light is white light, for example.

Starting from the distribution element 21, the light then passes into the output coupling structures 22. The ends of the output coupling structures 22 facing away from the distribution element 21 form output coupling surfaces 23. The light exits the optical waveguide 2 via the output coupling surfaces 23.

FIG. 1A shows a shaped body 4 between the output coupling structures 22. The shaped body 4 surrounds the output coupling structures 22 laterally and is in positive contact with the output coupling structures 23. In this case, the shaped body 4 between the output coupling structures 22 is different from the shaped body 41 around the semiconductor chips 10. For example, an interface is formed between the two shaped bodies 4, 41. However, the shaped body 4 between the output coupling structures 22 can also contain silicone with embedded $TiO_2$ particles.

A structure 3, which is nontransmissive to the radiation of the emission zones 1a, 1b, 1c, is applied to a side of the shaped body 4 facing away from the optical waveguide 2 and in the region between the output coupling structures 22. In the present case, the nontransmissive structure 3 is a layer on the shaped body 4. The nontransmissive structure 3 appears preferably black to an observer.

Figure 1B:
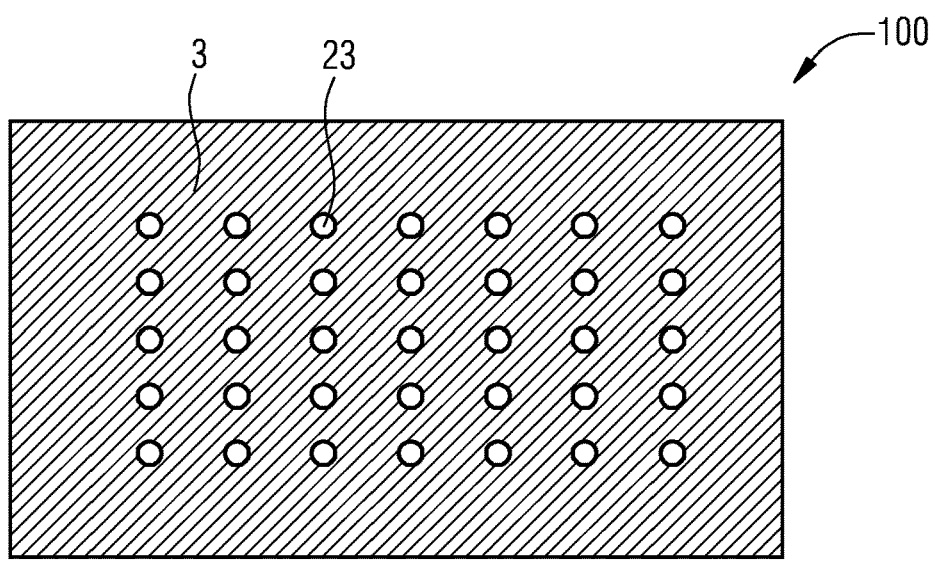

FIG. 1B shows a top view of a side of the optical waveguide 2 facing away from the emission zones 1a. It can be seen that the nontransmissive structure 3 completely covers the optical waveguide 2 except for the output coupling surfaces 23. During operation, light is only emitted via the output coupling surfaces 23. If the component 1 is switched off, the component 100 appears black in this top view. This is especially due to the fact that the area occupancy density of the nontransmissive structure 3 seen in this top view is much higher than that of the output coupling surfaces 23.

Figure 2:
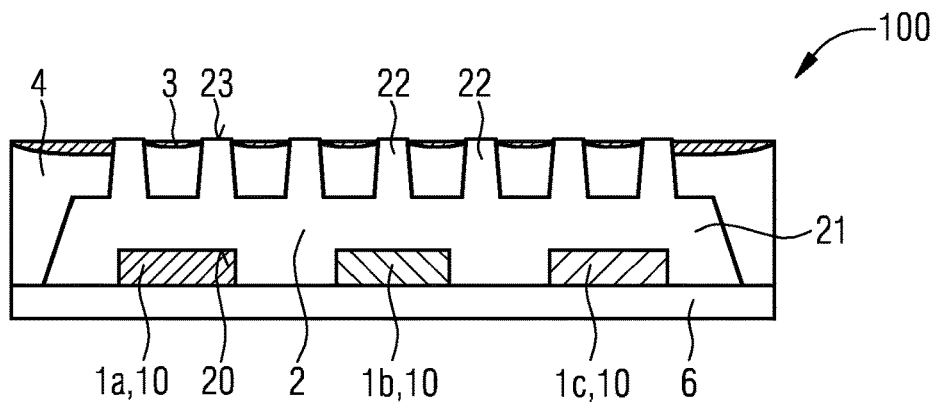

FIG. 2 shows a second exemplary embodiment of the optoelectronic component 100 in cross-sectional view. This second exemplary embodiment differs from the first one in that the entrance side 20 is not flat but comprises bulges. One of the semiconductor chips 10 is arranged in each of the bulges. Thus the semiconductor chips 10 are at least partially embedded in the optical waveguide 2. For example, the semiconductor chips 10 are formed with the optical waveguide 2, e.g. by potting or molding.

Figure 3:
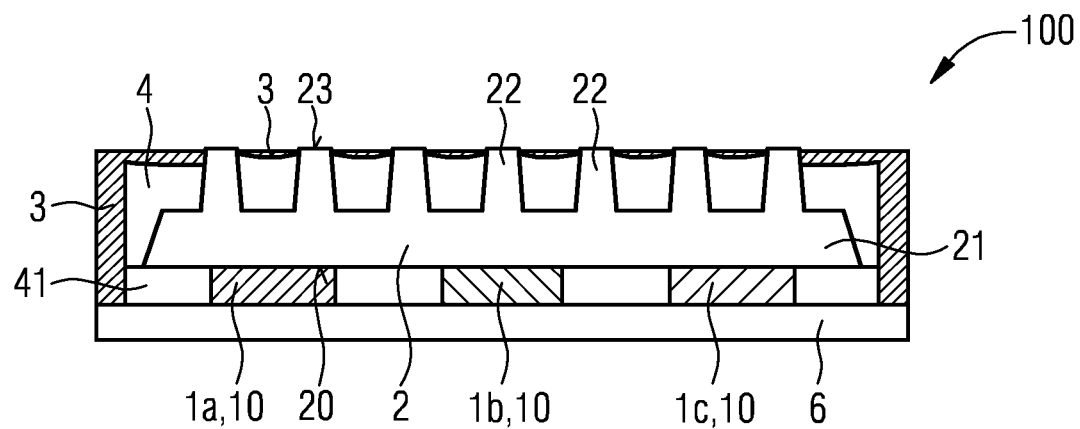

In FIG. 3 a third exemplary embodiment of the optoelectronic component 100 is shown. In this exemplary embodiment, the nontransmissive structure 3 covers not only a side of the shaped body 4 remote from the first emission zone 1*a*, but also side surfaces of the shaped body 4 that are transverse or perpendicular to this side.

Figure 4:
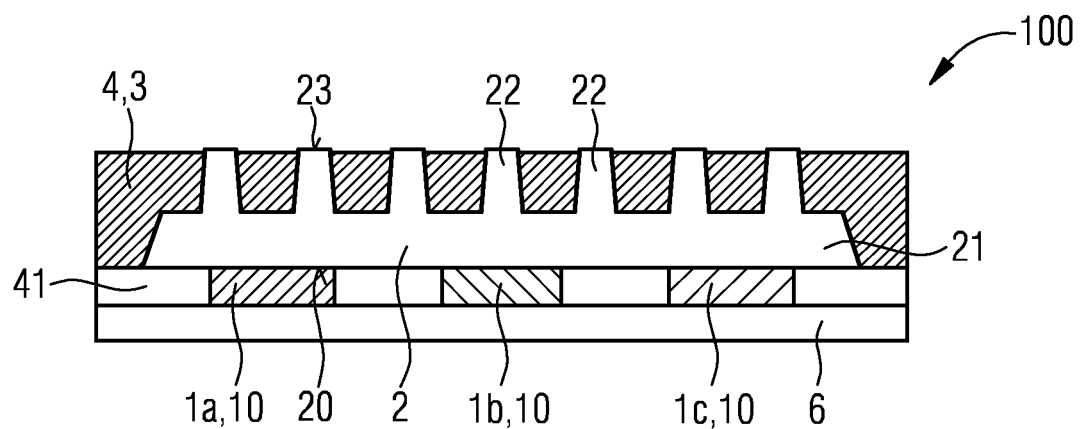

In the fourth exemplary embodiment of FIG. 4, different from the previously described embodiments, the shaped body 4 itself is the nontransmissive structure 3. The shaped body 4 here consists of a black material.

In the fifth exemplary embodiment of the optoelectronic component 100 shown in FIG. 5, the optoelectronic component 100 comprises a housing body 5 with a cavity 50. The semiconductor chips 10, which are assigned to the emission zones 1*a*, 1*b*, 1*c*, are arranged on a bottom surface of the cavity 50. Furthermore, the optoelectronic component 100 comprises a leadframe 7 on which the semiconductor chips 10 are arranged and electrically connected. The leadframe 7 together with the housing body 5 forms a carrier of the component 100.

The optical waveguide 2 is arranged on the semiconductor chips 10 in the region of the cavity 50 of the housing body 5. In a direction away from the semiconductor chips 10, the optical waveguide 2 does not protrude beyond the housing body 5.

Furthermore, the cavity 50 is filled with a shaped body 4, in this case a potting compound. The shaped body is also located between the output coupling structures 22 of the optical waveguide 2. On a side of the shaped body 4 facing away from the semiconductor chips 10, the nontransmissive structure 3 is again arranged.

FIG. 6 shows a sixth exemplary embodiment of the optoelectronic component 100. In contrast to the previous exemplary embodiments, the longitudinal axes of the output coupling structures 22 do not run perpendicular to the main extension plane of the distribution element 21. Instead, the longitudinal axes of the output coupling structures 22 each enclose an angle with normals to the main extension plane of the distribution element 21 of, for example, at least 10°. Due to this tilting of the output coupling structures 22, the radiation emitted via the output coupling surfaces 23 comprises a main emission direction which is not perpendicular to the main extension plane of the distribution element 21.

FIGS. 7A and 7B show exemplary embodiments of a display device 1000. The display device 1000 is a video screen. The display device 1000 comprises several optoelectronic components 100.

FIG. 7A shows an exemplary embodiment where the components 100 are formed like the components of one of the FIGS. 1 to 5. The light emitted via the output coupling surfaces of the output coupling structures is emitted with a main emission direction perpendicular to the main extension plane of the distribution element and thus perpendicular to the main extension plane of the video screen.

FIG. 7B, however, shows an exemplary embodiment where the optoelectronic components 100 are selected as in the example in FIG. 6. Due to the inclination or tilt of the output coupling structures, the light is mainly coupled out downwards, in the direction of an observer.

FIG. 8A shows a seventh exemplary embodiment of an optoelectronic component 100. The device 100 corresponds essentially to the device 100 in FIG. 1A. However, unlike in FIG. 1A, here the optical waveguide 2 is part of an optical waveguide compound which extends over several components and comprises several optical waveguides 2 which are connected to each other. For example, the optical waveguide compound is formed in one piece.

The optical waveguide compound is shown again separately in FIG. 8B. In the region between two optical waveguides 2 or between two components, the optical waveguide compound is thinned with a thickness of, for example, no more than 25% of the thickness of the distribution elements.

An optical waveguide compound as shown in FIG. 8B can be used in a display device as shown in FIGS. 7A and 7B. For example, the optical waveguides of all components are then part of the optical waveguide compound.

This patent application claims the priority of the German patent applications 10 2018 117 591.4, the disclosure content of which is hereby incorporated by reference.

The invention is not limited to the exemplary embodiments in the specification. Rather, the invention comprises each new feature as well as each combination of features, which in particular includes each combination of features in the claims, even if these features or this combination itself is not explicitly specified in the claims or exemplary embodiments.

LIST OF REFERENCE SIGNS

1*a* emission zone
1*b* emission zone
1*c* emission zone
2 optical waveguide
3 nontransmissive structure
4 shaped body
5 housing body
6 carrier
7 leadframe
10 semiconductor chip
20 entrance side
21 distribution element
22 output coupling structure
23 output coupling surface
41 shaped body
50 cavity in the housing body 5
100 optoelectronic component
1000 display device

The invention claimed is:
1. An optoelectronic component comprising:
a first emission zone emitting electromagnetic radiation during operation,
an optical waveguide arranged downstream of the first emission zone, with an entrance side facing towards the first emission zone, with a distribution element and with output coupling structures on a side of the distribution element facing away from the first emission zone, wherein
the optical waveguide is a simply connected solid body and is formed in one piece,
in a top view of the side of the optical waveguide facing away from the first emission zone, the distribution element completely covers the first emission zone and at least two output coupling structures overlap the first emission zone,
the output coupling structures are individual, spaced-apart elevations which each extend away from the distribution element and each comprise an output coupling surface at an end remote from the distribution element,
during specified normal operation, the radiation emitted by the first emission zone enters the optical waveguide via the entrance side, then passes through the distribution element and finally exits the optical waveguide via the output coupling surface of the output coupling structures, a structure that is nontransmissive for the radiation of the first emission zone is arranged on the optical waveguide in the region between the output coupling structures.

2. The optoelectronic component according to claim 1, wherein
the component comprises one or more further emission zones, which each emit electromagnetic radiation during operation,
in a top view of a side of the optical waveguide facing away from the first emission zone, the distribution element covers the further emission zone(s),
during operation the radiation coming from the emission zones, enters the optical waveguide via the entrance side and is mixed in the distribution element.

3. The optoelectronic component according to claim 2, wherein the radiations coming from two different emission zones are radiations of different wavelength ranges.

4. The optoelectronic component according to claim 2, wherein the optoelectronic component comprises a plurality of optoelectronic semiconductor chips arranged on a common carrier, and a semiconductor chip is uniquely assigned to each emission zone.

5. The optoelectronic component according to claim 1, wherein the output coupling structures are elongated elevations each having a longitudinal axis transverse to a main extension plane of the distribution element.

6. The optoelectronic component according to claim 5, wherein the longitudinal axes of the output coupling structures are perpendicular to the main extension plane of the distribution element.

7. The optoelectronic component according to claim 5, wherein the longitudinal axes of the output coupling structure are tilted relative to a normal of the main extension plane of the distribution element.

8. The optoelectronic component according to claim 1, wherein the distribution element is a substantially platelet-shaped portion of the optical waveguide.

9. The optoelectronic component according to claim 1, wherein, in a top view of a side of the optical waveguide remote from the first emission zone, the optical waveguide is completely covered with the nontransmissive structure except for the output coupling surfaces.

10. The optoelectronic component according to claim 1, wherein the nontransmissive structure is absorptive of the radiation emitted from the first emission zone.

11. The optoelectronic component according to claim 1, further comprising
a shaped body between the output coupling structure, which surrounds the output coupling structures, wherein
the shaped body is nontransmissive to the radiation emitted by the first emission zone.

12. The optoelectronic component according to claim 11, wherein the nontransmissive structure is arranged on a side of the shaped body facing away from the distribution element or is formed by the shaped body.

13. The optoelectronic component according to claim 11, wherein the shaped body is reflective for the radiation emitted from the first emission zone.

14. The optoelectronic component according to claim 1, wherein the component comprises an optoelectronic semiconductor chip assigned to the first emission zone, on which the optical waveguide is glued.

15. The optoelectronic component according to claim 1, wherein the component comprises an optoelectronic semiconductor chip assigned to the first emission zone, which is partially embedded in the optical waveguide.

16. The optoelectronic component according to claim 1, the component comprising an optoelectronic semiconductor chip assigned to the first emission zone, which is partially embedded in a shaped body, wherein the shaped body prevents radiation from exiting the semiconductor chip in a lateral direction.

17. A display device having an optoelectronic component according to claim 1.

* * * * *